United States Patent
Yun et al.

(10) Patent No.: US 7,605,623 B2
(45) Date of Patent: Oct. 20, 2009

(54) SEMICONDUCTOR MEMORY APPARATUS WITH A DELAY LOCKED LOOP CIRCUIT

(75) Inventors: Won-Joo Yun, Kyoungki-do (KR); Hyun-Woo Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 10 days.

(21) Appl. No.: 11/824,428

(22) Filed: Jun. 29, 2007

(65) Prior Publication Data

US 2008/0079470 A1 Apr. 3, 2008

(30) Foreign Application Priority Data

Sep. 29, 2006 (KR) .................. 10-2006-0096512

(51) Int. Cl.
*H03L 7/06* (2006.01)

(52) U.S. Cl. ...................... 327/158; 327/161
(58) Field of Classification Search .......... 327/158, 327/161
See application file for complete search history.

(56) References Cited

U.S. PATENT DOCUMENTS

| | | | |
|---|---|---|---|
| 6,813,197 B2 | 11/2004 | Park | |
| 6,956,418 B2 * | 10/2005 | Kwak et al. | .......... 327/158 |
| 6,989,700 B2 | 1/2006 | Kim | |
| 7,103,133 B2 | 9/2006 | Jung | |
| 7,154,311 B2 | 12/2006 | Lim | |
| 7,170,313 B2 | 1/2007 | Shin | |
| 2004/0085107 A1 * | 5/2004 | Kwak et al. | .......... 327/158 |
| 2005/0110540 A1 * | 5/2005 | Kwak | .......... 327/158 |
| 2005/0195663 A1 * | 9/2005 | Kwak | .......... 365/194 |
| 2006/0267649 A1 | 11/2006 | Park et al. | |

FOREIGN PATENT DOCUMENTS

| | | |
|---|---|---|
| JP | 2005-251370 A | 9/2005 |
| KR | 2001-0044876 | 6/2001 |
| KR | 10-2004-0046328 | 6/2004 |
| KR | 10-2004-0095981 | 11/2004 |
| KR | 10-2006-0095260 | 8/2006 |

* cited by examiner

*Primary Examiner*—Lincoln Donovan
*Assistant Examiner*—John W Poos
(74) *Attorney, Agent, or Firm*—Blakely, Sokoloff, Taylor & Zafman LLP (57) ABSTRACT

A semiconductor memory apparatus includes a delay line configured to delay a reference clock, a first delay block configured to delay a feedback clock, a first phase comparator configured to compare the reference clock with an output of the first delay block, a second delay block configured to delay the reference clock, a second phase comparator configured to compare the feedback clock with an output of the second delay block, a delay controller configured to control a delay amount of the delay line based on comparison results from the first and second phase comparators, a delay model configured to delay an output of the delay line by a modeled delay time to generate the feedback clock, and a locking detector configured to control the delay controller based on comparison results from the first and second phase comparators.

27 Claims, 8 Drawing Sheets

SEMICONDUCTOR MEMORY APPARATUS WITH A DELAY LOCKED LOOP CIRCUIT

CROSS-REFERENCE TO RELATED APPLICATIONS

The present invention claims priority of Korean patent application number 10-2006-0096512, filed on Sep. 29, 2006, which is incorporated by reference in its entirety.

BACKGROUND OF THE INVENTION

The present invention relates to a semiconductor device, and more particular, to a semiconductor memory apparatus with a delay locked loop circuit.

A semiconductor memory apparatus embodied in a system which includes a plurality of semiconductor devices is used for storing data. The semiconductor memory apparatus outputs data stored in a cell corresponding to an address outputted from a data requesting unit such as a central processing unit or stores data provided from the data requesting unit into the cell.

As an operational speed of a system including a plurality of semiconductor devices has increased and a technology related to a semiconductor integrated circuit has advanced, there has been a demand for increasing data access speed of the semiconductor memory apparatus. In order to access data of semiconductor memory apparatus with a high speed, a synchronous memory device which receives a system clock and can access data every time synchronized with transition of the received system clock has been proposed. Nevertheless, the synchronous memory device cannot meet data access speed required by the system, particularly, the data requesting unit included in the system. Accordingly, a double data rate (DDR) synchronous semiconductor memory apparatus is proposed which can access data every rising edge and falling edge of the system clock.

The DDR synchronous semiconductor memory apparatus should receive or output two data within one cycle of the system clock, since the DDR synchronous semiconductor memory apparatus accesses one data every transition of the system clock. That is, the DDR synchronous semiconductor memory apparatus should output or receive data every time exactly synchronized with the rising edge and falling edge of the system clock. Typically, the output circuit of the DDR synchronous semiconductor memory apparatus receives the system clock through a clock transfer path including a clock buffer, clock transmission lines, and the like inside the DDR synchronous semiconductor memory apparatus and outputs data synchronized with the received system clock.

However, the system clock reaches the output circuit of the DDR synchronous semiconductor memory apparatus with an essential delay occurring while passing through the clock input buffer and the clock signal transmission lines arranged in the DDR synchronous semiconductor memory apparatus. Although the output circuit outputs data in synchronization with the reached system clock, data delayed by the essential delay are inputted to an external device receiving data from the DDR synchronous semiconductor memory apparatus.

To solve above described problem, the DDR synchronous semiconductor memory apparatus includes a circuit, i.e., a delay locked loop circuit for adjusting the essential delay by locking a delay of the transferred system clock. The delay locked loop compensates for a delay value caused by the clock transfer path of the semiconductor memory apparatus. The delay locked loop circuit detects a delay value which occurs while an inputted system clock passes through the clock transfer path including the clock input circuit, the clock signal transmission lines, and the like and delays the inputted system clock for a delay time corresponding to the detected delay value to thereby output the delayed system clock into the output circuit. That is, the delay locked loop circuit intentionally delays and locks the inputted system clock by a constant delay value depending on an amount of the detected delay value to output the delay locked clock into the output circuit. Then, the output circuit outputs a data synchronized with the delay locked clock. The data outputted from the output circuit is exactly transferred to the external device, synchronized with the system clock.

Substantially, the delay locked clock is inputted to the output circuit at one previous cycle before the data is outputted; and, synchronized with the delay locked clock, the output circuit outputs the data. Namely, for synchronizing the outputted data with the system clock, the data should be outputted faster than the system clock is delayed on the clock transfer path. Outside the semiconductor memory apparatus, the outputted data are exactly synchronized with rising and falling edges of the system clock, input to the semiconductor memory apparatus. Consequently, the delay locked loop is a circuit for determining how much the data is outputted faster than the timing of data output in order to compensate the delay value of the system clock inside the semiconductor memory apparatus.

Figure 1:
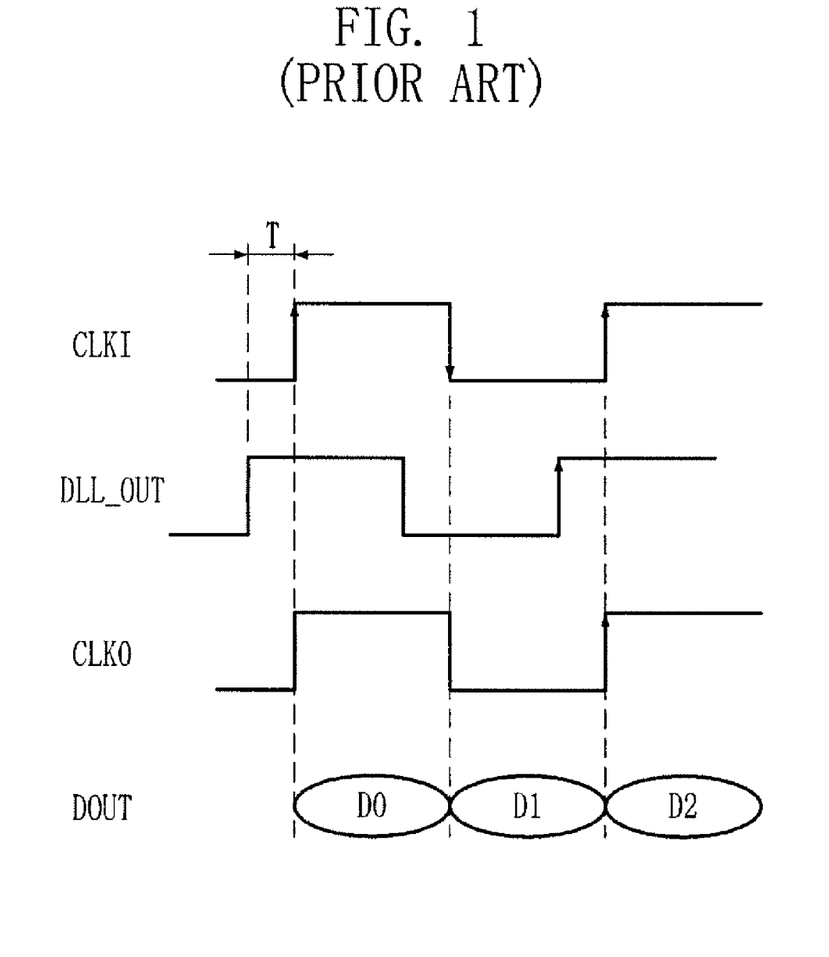
FIG. 1 illustrates a timing diagram describing an operation of a delay locked loop for use in a conventional semiconductor memory apparatus.

FIG. 1 illustrates a timing diagram describing an operation of a delay locked loop for use in a conventional semiconductor memory apparatus.

As shown, the delay locked loop generates a delay locked clock DLL_OUT whose phase leads that of inputted internal clock CLKI. Herein, the internal clock CLKI is generated based on an external clock CLK0 from a clock buffer or an internal clock generator. The semiconductor memory apparatus outputs data D0, D1, and D2, synchronized with the delay locked clock DLL_OUT. If the data D0, D1, and D2 are synchronized with the delay locked clock DLL_OUT, the data can be also synchronized with the external clock CLK0.

Generally, the delay locked loop includes a delay line for delaying an internal clock, a delay line controller for controlling a delay amount of the delay line, a delay model for delaying an output of the delay line by an estimated amount, i.e., how long the internal clock is delayed by a clock path inside the semiconductor memory apparatus, and a phase comparator for comparing a phase of the internal clock with that of an output of the delay model. If the delay locked loop achieves a locking state, i.e., is able to generate a proper delay locked clock for outputting data, a locking detector senses the locking state to generate a locking sense signal. When the locking detector generates the locking sense signal, the semiconductor memory apparatus outputs data in synchronization with transitions, i.e., rising and falling edges, of the delay locked clock generated from the delay locked loop.

If the locking detector may recognize the locking state and generate the locking sense signal when the delay locked loop does not achieve the locking state, the semiconductor memory apparatus receives wrong information and outputs data in synchronization with an incomplete delay locked clock. In this case, outputted data may not be synchronized with the system clock. As a result, a system or an external device can not receive the outputted data from the semiconductor memory apparatus.

SUMMARY OF THE INVENTION

Embodiments of the present invention are directed to provide a semiconductor memory apparatus for detecting a locking state of a delay locked loop without an error to thereby increase operation reliability thereof.

In accordance with an aspect of the present invention, there is provided a semiconductor memory apparatus including a delay line configured to delay a reference clock, a first delay block configured to delay a feedback clock, a first phase comparator configured to compare the reference clock with an output of the first delay block, a second delay block configured to delay the reference clock, a second phase comparator configured to compare the feedback clock with an output of the second delay block, a delay controller configured to control a delay amount of the delay line based on comparison results from the first and second phase comparators, a delay model configured to delay an output of the delay line by a modeled delay time to generate the feedback clock, and a locking detector configured to control the delay controller based on comparison results from the first and second phase comparators.

In accordance with another aspect of the present invention, there is provided a semiconductor memory apparatus, including a coarse delay line configured to delay a reference clock, a fine delay line configured to delay an output from the coarse delay line, a first delay block configured to delay a feedback clock. A first phase comparator configured to compare the reference clock with an output of the first delay block, a second delay block configured to delay the reference clock, a second phase comparator configured to compare the feedback clock with an output of the second delay block, a third phase comparator configured to compare the feedback clock with the reference clock, a delay controller configured to control delay amounts of the coarse and fine delay lines based on comparison results from the first to third phase comparators, a delay model configured to delay an output of the delay line by a modeled delay time to generate the feedback clock, and a locking detector configured to control the delay controller based on comparison results from the first and second phase comparators.

In accordance with another aspect of the present invention, there is provided a method for operating a semiconductor memory apparatus, comprising delaying a reference clock by a delay amount to generate a delay clock, delaying a feedback clock by a first amount to generate a delayed feedback clock, comparing the reference clock with the delayed feedback clock, delaying the reference clock by a second amount to generate a delayed reference clock, comparing the feedback clock with the delayed reference clock, controlling the delay amount based on results of the comparing the reference clock with the delayed feedback clock and the comparing the feedback clock with the delayed reference clock, delaying the delay clock by a modeled delay time to generate the feedback clock, and controlling the delay amount based on the results.

In accordance with another aspect of the present invention, there is provided a method for operating a semiconductor memory apparatus, including delaying a reference clock by a first delay amount to generate a first delay clock, delaying the first delay clock by a second delay amount to generate a second delay clock, delaying a feedback clock by a first amount to generate a delayed feedback clock, comparing the reference clock with the delayed feedback clock, delaying the reference clock by a second amount to generate a delayed reference clock, comparing the feedback clock with the delayed reference clock, comparing the feedback clock with the reference clock, controlling the first and second delay amounts based on comparison results of the comparing the reference clock with the delayed feedback clock, the comparing the feedback clock with the delayed reference clock, and the comparing the feedback clock with the reference clock, delaying the second delay clock by a modeled delay time to generate the feedback clock, and controlling the delay amount based on the results.

In accordance with another aspect of the present invention, there is provided a semiconductor memory apparatus, including a delay locked loop configured to perform a delay locking operation by comparing a reference clock with a feedback clock to thereby generate a delay locked clock and a locking detector configured to control the delay locking operation based on results of comparing a delay signal of the reference clock with the feedback clock and comparing the reference clock with a delay signal of the feedback clock.

DESCRIPTION OF SPECIFIC EMBODIMENTS

In accordance with an embodiment of the present invention, a semiconductor memory apparatus can perform a delay locking operation accurately even though inputted clock is distorted by noise or jitter. Thus, the semiconductor memory apparatus can accurately output data in synchronization with a system clock although the system clock having noise or jitter is inputted.

Hereinafter, a semiconductor memory apparatus in accordance with specific embodiments of the present invention will be described in detail with reference to the accompanying drawings.

Figure 2:
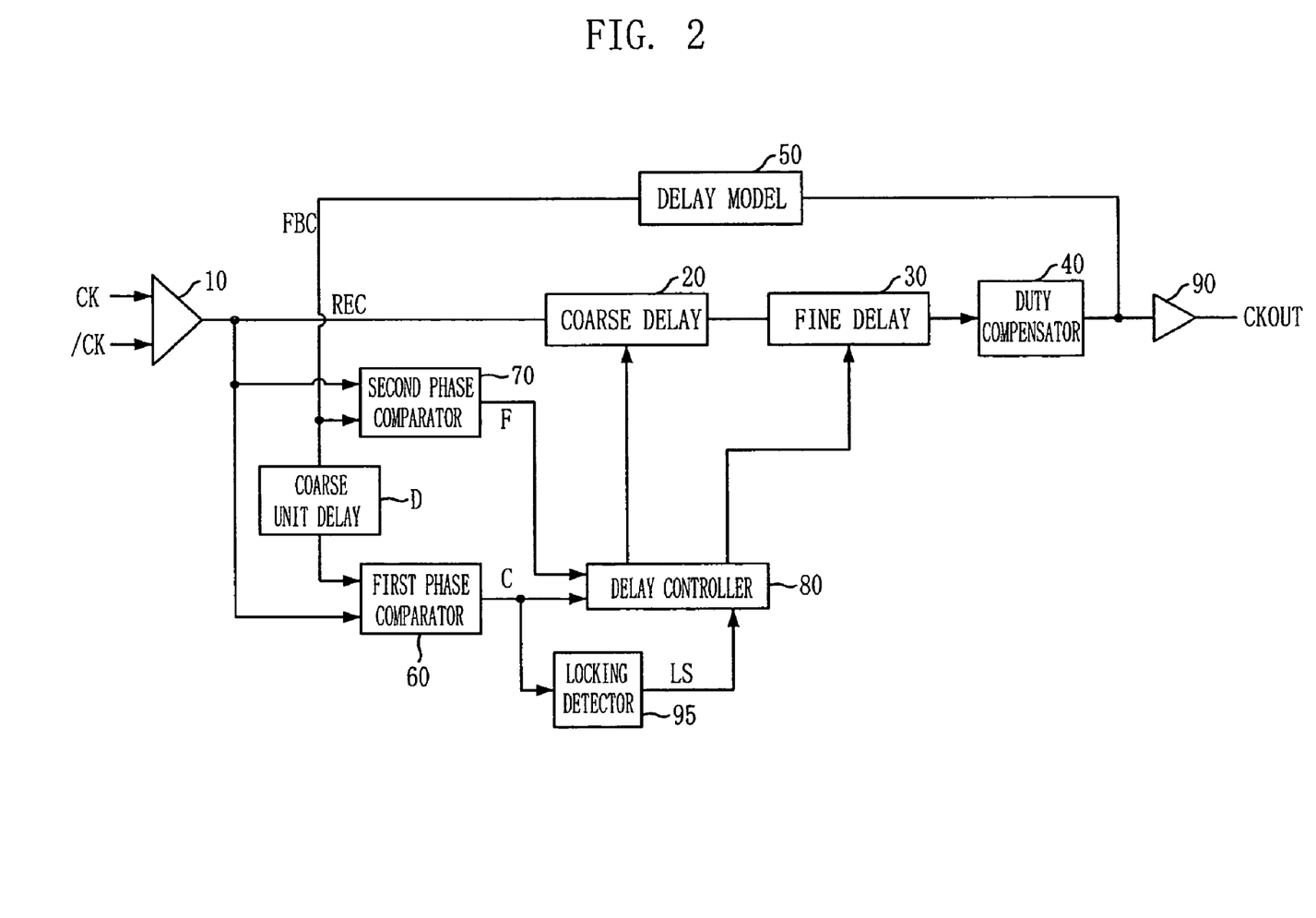
FIG. 2 illustrates a block diagram of a delay locked loop in a semiconductor memory apparatus according to an embodiment of the present invention.

FIG. 2 illustrates a block diagram of a delay locked loop in a semiconductor memory apparatus according to an embodiment of the present invention.

As shown, the semiconductor memory apparatus includes a clock input buffer 10, a coarse delay line 20, a fine delay line 30, a duty compensator 40, a delay model 50, a first phase comparator 60, a second phase comparator 70, a delay controller 80, a clock output buffer 90, a locking detector 95, and a coarse delay block D.

The clock buffer 10 receives system clocks CLK and CLKB to generate a reference clock REC. The coarse delay line 20 delays the reference clock REC by a delay amount controlled by the delay controller 80, and the fine delay line 30 receives an output of the coarse delay line 20 and delays the output by another delay amount also controlled by the delay controller 80. Herein, the coarse delay line 20 and the fine delay line 30 respectively includes plural delay units coupled to each other in the shape of a chain. In each of the coarse delay line 20 and the fine delay line 30, how many delay units are used for delaying an inputted signal is determined by the delay controller 80. Further, the delay unit included in the coarse delay line 20 has a longer delay time than that in the fine delay line 30. The duty compensator 40 compensates a duty ratio of an output from the fine delay line 30 to generate a delay locked clock CKOUT having a compensated duty ratio. The clock output buffer 90 buffers the delay locked clock CKOUT to transfer into a data output buffer in the semiconductor memory device.

The delay model 50 delays an output of the duty compensator 40 by a modeled delay time to generate a feedback clock FBC. Herein, the modeled delay time means an estimated amount of time the internal clock is delayed by a clock path inside the semiconductor memory apparatus. The coarse delay block D receives the feedback clock FBC to delay the feedback clock FBC by a delay time of one delay unit included in the coarse delay line 20.

The first phase comparator 60 compares the reference clock REC with an output of the coarse delay block D. The second phase comparator 70 compares the feedback clock FBC with the reference clock REC. The delay controller 80 controls the delay amounts of the coarse and fine delay lines 20 and 30 based on comparison results from the first and second phase comparators 60 and 70. The locking detector 95 generates a locking signal LS based on the comparison result from the first phase comparator 60 to thereby control the delay controller 80.

Figure 3:
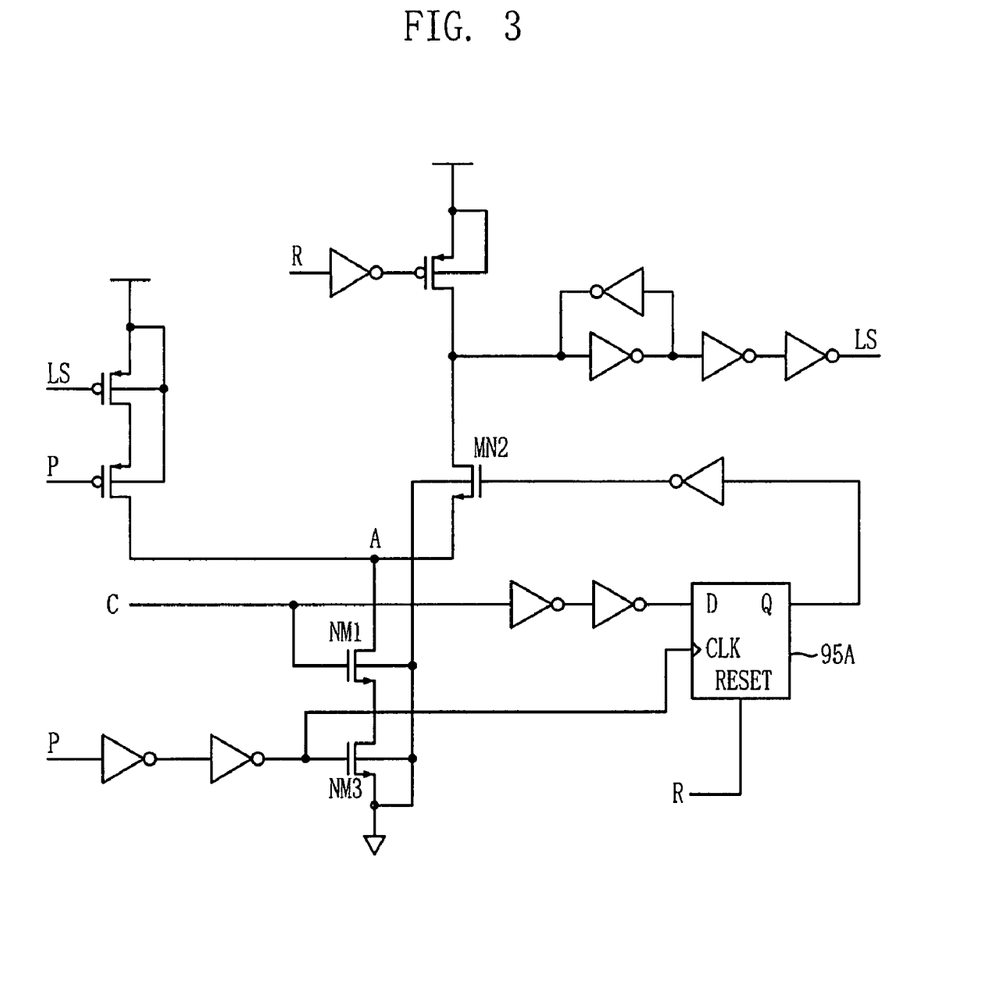
FIG. 3 illustrates a schematic circuit diagram of an embodiment of a locking detector shown in FIG. 2.

FIG. 3 illustrates a schematic circuit diagram of an embodiment of the locking detector 95 shown in FIG. 2.

As shown, the locking detector 95 included in the semiconductor memory apparatus receives a pulse signal P, a reset signal R, and a first phase detection signal C to generate the locking signal LS.

Herein, the reset signal R is for initializing a delay locking operation of the semiconductor memory apparatus. If the reset signal R becomes activated, the locking signal LS is reset as a logic low level. The pulse signal P is activated periodically like a pulse in order to update the delay locking operation. Lastly, the first phase detection signal C is activated when the reference clock REC and the output of the coarse delay block D, i.e., inputted signals of the first phase comparator 60, have the same phase.

Figure 4A:
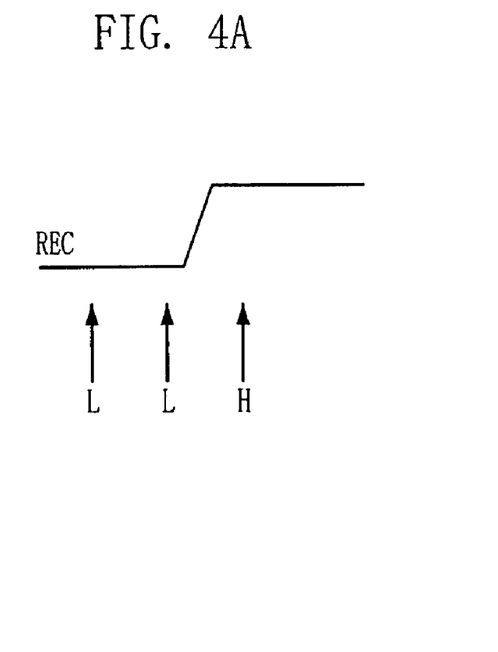
FIGS. 4A and 4B illustrate timing diagrams describing an operation of the delay locked loop shown in FIG. 2.
Figure 4B:
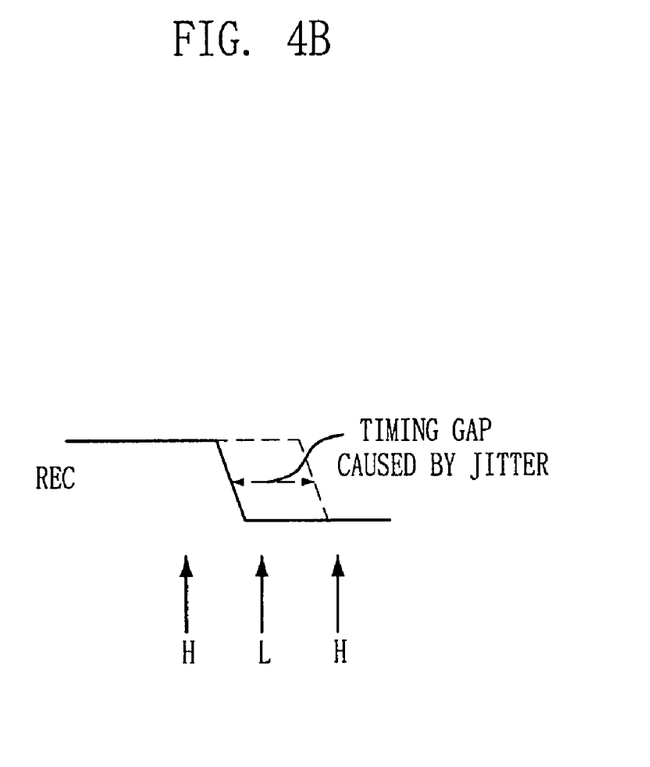

FIGS. 4A and 4B illustrate timing diagrams describing an operation of the delay locked loop shown in FIG. 2. Hereinafter, referring to FIGS. 2 to 4B, the delay locking operation and an operation of the locking detector 95 is shown in detail.

The clock buffer 10 receives system clocks CLK and CLKB to generate a reference clock REC. The coarse delay line 20 delays the reference clock REC by a delay amount which is initially set, and the fine delay line 30 delays an output of the coarse delay line 20 by an initial delay amount. The duty compensator 40 compensates a duty ratio of the output from the fine delay line 30 to output to the delay model 50. The delay model 50 delays the output of the duty compensator 40 by the modeled delay time to generate the feedback clock FBC.

The first phase comparator 60 compares the reference clock REC outputted from the clock buffer 10 with an output of the coarse delay block D, which is delayed from the feedback clock FBC outputted from the delay model 50 by a delay time of one delay unit in the coarse delay line 30. If phases of two input signals, i.e., the reference clock REC and the output of the coarse delay block D, are not same, the first phase detection signal C is inactivated. In response to the inactivated phase detection signal, the delay controller 80 controls a delay amount of the coarse delay line 20. Otherwise, if the two input signals of the first phase comparator 60 have the same phase, the first phase detection signal C is activated. The delay controller 80 locks the delay amount of the coarse delay line 20 in response to the activated phase detection signal. These operations of the delay controller 80 are controlled by the locking detector 95. The locking detector 95 checks the first phase detection signal C, and if the first phase detection signal C is activated, the locking signal LS is activated and outputted to the delay controller 80. That is, if the first phase detection signal C is activated, operation for adjusting or changing a delay amount of the coarse delay line 20 is terminated.

Thereafter, the fine delay line 30 delays the output of the coarse delay line 20 by an initial delay amount. The duty compensator 40 compensates a duty ratio of the output from the fine delay line 30 to output to the delay model 50. The delay model 50 delays the output of the duty compensator 40 by the modeled delay time to generate the feedback clock FBC.

The second phase comparator 70 compares the feedback clock FBC with the reference clock REC to generate a second phase detection signal F. If the feedback clock FBC and the reference clock REC have substantially different phases, the second phase detection signal F is inactivated. Otherwise, if phases of two signals of the second phase comparator 70, i.e., the feedback clock FBC and the reference clock REC, are the same, the second phase detection signal F is activated. In response to the inactivated second phase detection signal, the delay controller 80 controls a delay amount of the fine delay line 30. When the delay amounts of the coarse and fine delay lines 20 and 30 are locked, the delay locking operation is terminated and the semiconductor memory apparatus achieves a locking state. Herein, the delay locked clock CKOUT outputted from the clock output buffer 90 is used for a data output. The semiconductor memory apparatus outputs plural data in synchronization with transitions of the delay locked clock CKOUT.

Further, operations of the locking detector 95 and the first phase comparator 60 are described in detail.

The first phase comparator 60 compares the reference clock REC with an output of the coarse delay block D. When the locking signal LS is inactivated as a logic low level, a node A shown in FIG. 3 is precharged by the pulse signal P inputted to the locking detector 95. If the first phase detection signal C is inputted as a logic low level, a flip-flop 95A stores a logic low level signal. The flip-flop 95A outputs the logic low level signal, and the logic low level signal is inverted by an inverter to turn on a MOS transistor MN2. Otherwise, if the first phase detection signal C is inputted as a logic high level, MOS transistors MN1 and MN2 are turned on. The pulse signal P becomes a logic high level, the MOS transistor MN3 are turned on so that the locking signal LS becomes a logic high level.

Referring to FIG. 4A, when the reference clock REC becomes a logic high level from a logic low level, the first phase detection signal C is activated according to a phase of the feedback clock FBC, and the locking detector 95 generates the locking signal LS having a logic high level. At this time, if the reference clock REC is distorted by jitter in the clock input buffer 10, the locking signal LS can have a wrong logic level, i.e., not properly activated or inactivated, as shown in FIG. 4B.

After the reference clock REC is transited from a logic high level to a logic low level, a logic high level signal is inputted to the first phase comparator 60 because of the jitter. In this case, the locking signal LS may be activated and outputted, and as a result, operation of adjusting a delay amount of the coarse delay line 20 is terminated. Actually, though the delay amount of the coarse delay line should be adjusted for achieving the locking state, the semiconductor memory apparatus can misunderstand that a delay locking operation for the coarse delay line 20 is properly finished. Then, a delay locking operation for the fine delay line 30 starts. At this time, because a phase difference between the reference clock REC and the feedback clock FEC decreases below a predetermined amount, the locking state cannot be achieved even though the delay locking operation for the fine delay line 30 is performed continuously. Although the semiconductor memory apparatus recognizes the locking state, the delay locked clock CKOUT may not be a desirable signal.

For overcoming above problem, in another embodiment of the present invention, the locking detector 95 determines a locking state based on a result of comparing the reference clock FBC with a signal delayed by a delay time of two delay units of the coarse delay line 30.

If an input clock to a phase comparator such as a feedback clock is adjusted, e.g., delayed by a predetermined amount, the phase comparator can find a transition of the reference clock REC even though the reference clock REC is distorted by jitter.

Figure 5:
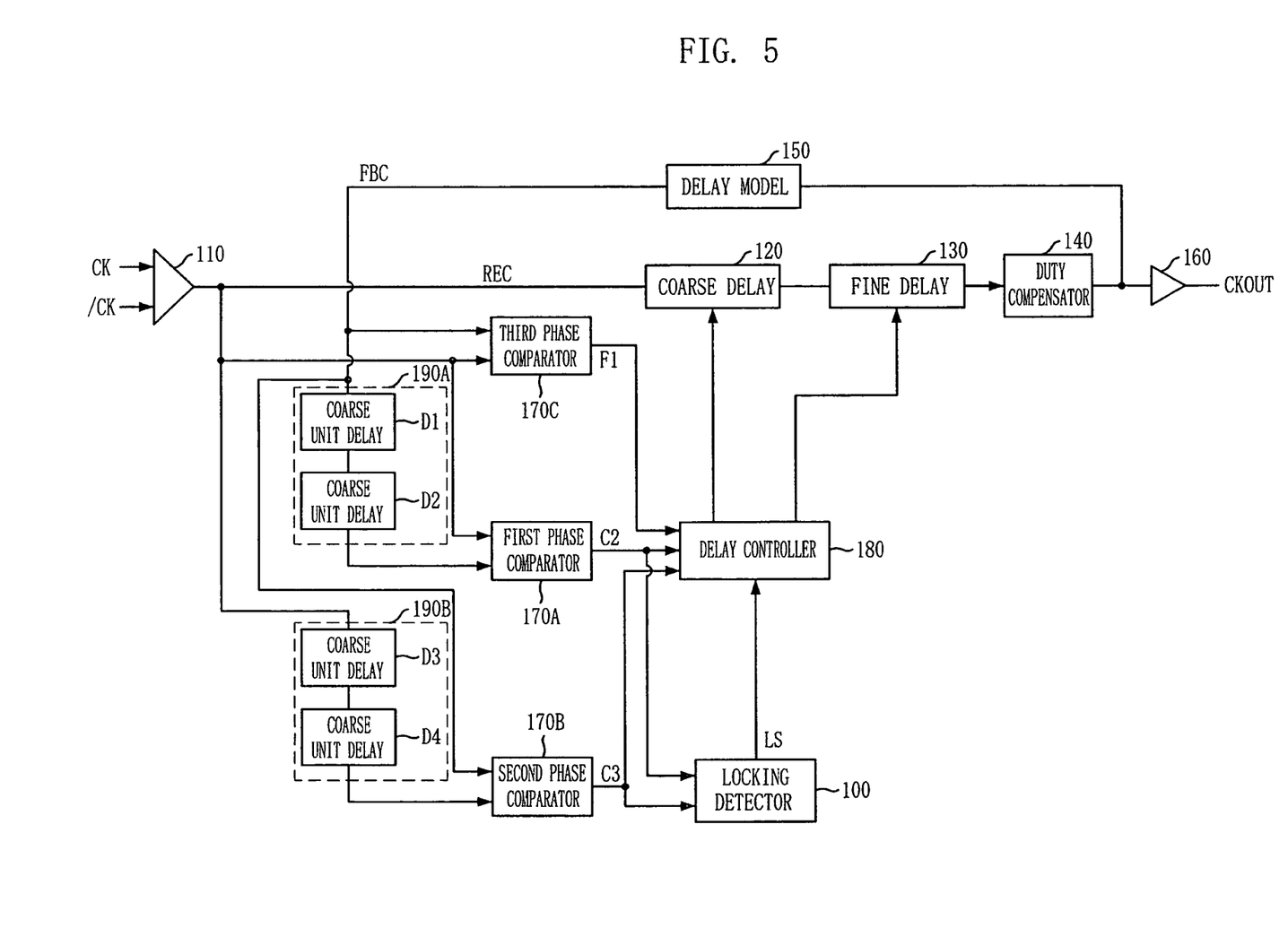
FIG. 5 illustrates a block diagram of a delay locked loop in a semiconductor memory apparatus according to another embodiment of the present invention.

FIG. 5 illustrates a block diagram of a delay locked loop in a semiconductor memory apparatus according to another embodiment of the present invention.

As shown, the semiconductor memory apparatus includes a clock input buffer 110, a coarse delay line 120, a fine delay line 130, a duty compensator 140, a delay model 150, a first phase comparator 170A, a second phase comparator 170B, a third phase comparator 170C, a delay controller 180, a clock output buffer 160, a locking detector 100, a first delay block 190A and a second delay block 190B.

The clock buffer 110 receives system clocks CLK and CLKB to generate a reference clock REC. The coarse delay line 120 delays the reference clock REC by a delay amount controlled by the delay controller 180, and the fine delay line 130 receives an output of the coarse delay line 120 and delays the output by another delay amount also controlled by the delay controller 180. Herein, the coarse delay line 120 and the fine delay line 130 respectively includes plural delay units coupled to each other in the shape of a chain. In each of the coarse delay line 120 and the fine delay line 130, how many delay units are used for delaying an inputted signal is determined by the delay controller 180. Further, the delay unit included in the coarse delay line 120 has a longer delay time than that in the fine delay line 130. The duty compensator 140 compensates a duty ratio of an output from the fine delay line 130 to generate a delay locked clock CKOUT having a compensated duty ratio. The clock output buffer 160 buffers the delay locked clock CKOUT to transfer into a data output buffer in the semiconductor memory device.

The delay model 150 delays an output of the duty compensator 140 by a modeled delay time to generate a feedback clock FBC. Herein, the modeled delay time means an estimated amount of time the internal clock is delayed by a clock path inside the semiconductor memory apparatus. The first delay block 190A includes first and second coarse delay blocks D1 and D2, the second delay block 190B includes third and fourth coarse delay blocks D3 and D4. Each of first to fourth coarse delay blocks D1 to D4 includes one delay unit included in the coarse delay line 130. Thus, the first delay block 190A delays the feedback clock FBC by double delay time of the delay unit in the coarse delay line 130, and the second delay block 190B delays the reference clock REC by double delay time of the delay unit. In another embodiment of the present invention, the number of the coarse delay blocks included in the first and second delay block 190A and 190B can be changed according to circumstance and condition on operation of a system having the semiconductor memory apparatus.

Figure 6:
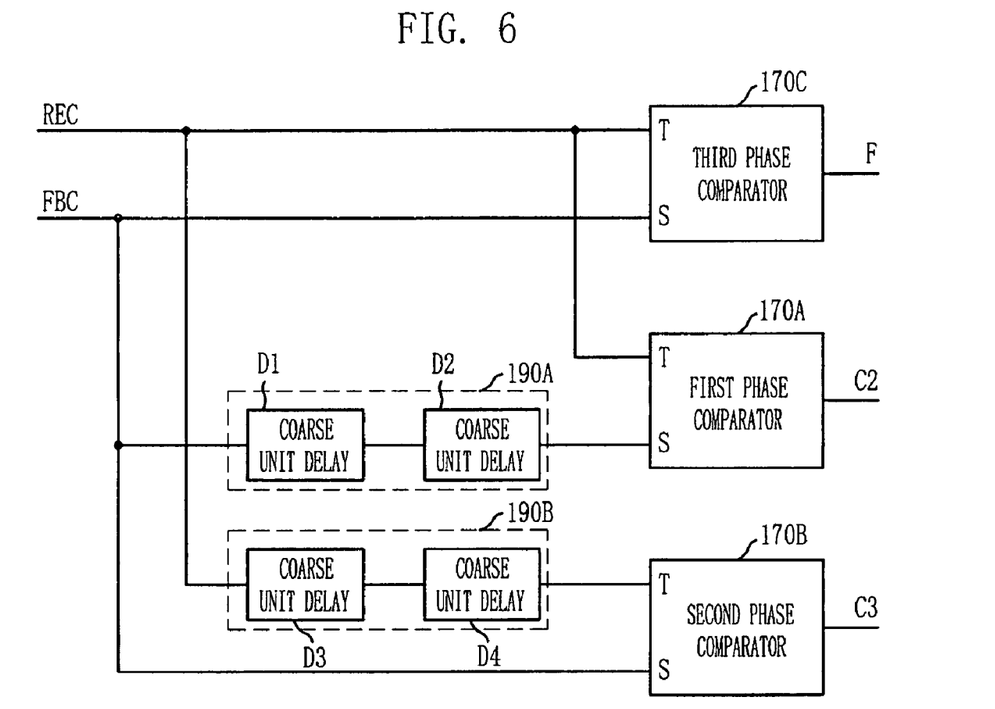
FIG. 6 illustrates a block diagram simplifying a part of the delay locked loop shown in FIG. 5.

FIG. 6 illustrates a block diagram simplifying a part of the delay locked loop shown in FIG. 5.

As shown, the semiconductor memory apparatus includes three phase comparators 170A, 170B, and 170C. The first phase comparator 170A compares the reference clock REC outputted from the clock input buffer 110 with an output of the first delay block 190A. The second phase comparator 170B compares the feedback clock FBC with an output of the second delay block 190B. The third phase comparator compares the reference clock REC with the feedback clock FBC. The delay controller 180 controls the delay amounts of the coarse and fine delay lines 120 and 130 based on comparison results from the first to third phase comparators 170A to 170C. The locking detector 100 generates a locking signal LS based on the comparison result from the first and second phase comparators 170A and 170B to thereby control the delay controller 180.

Figure 7:
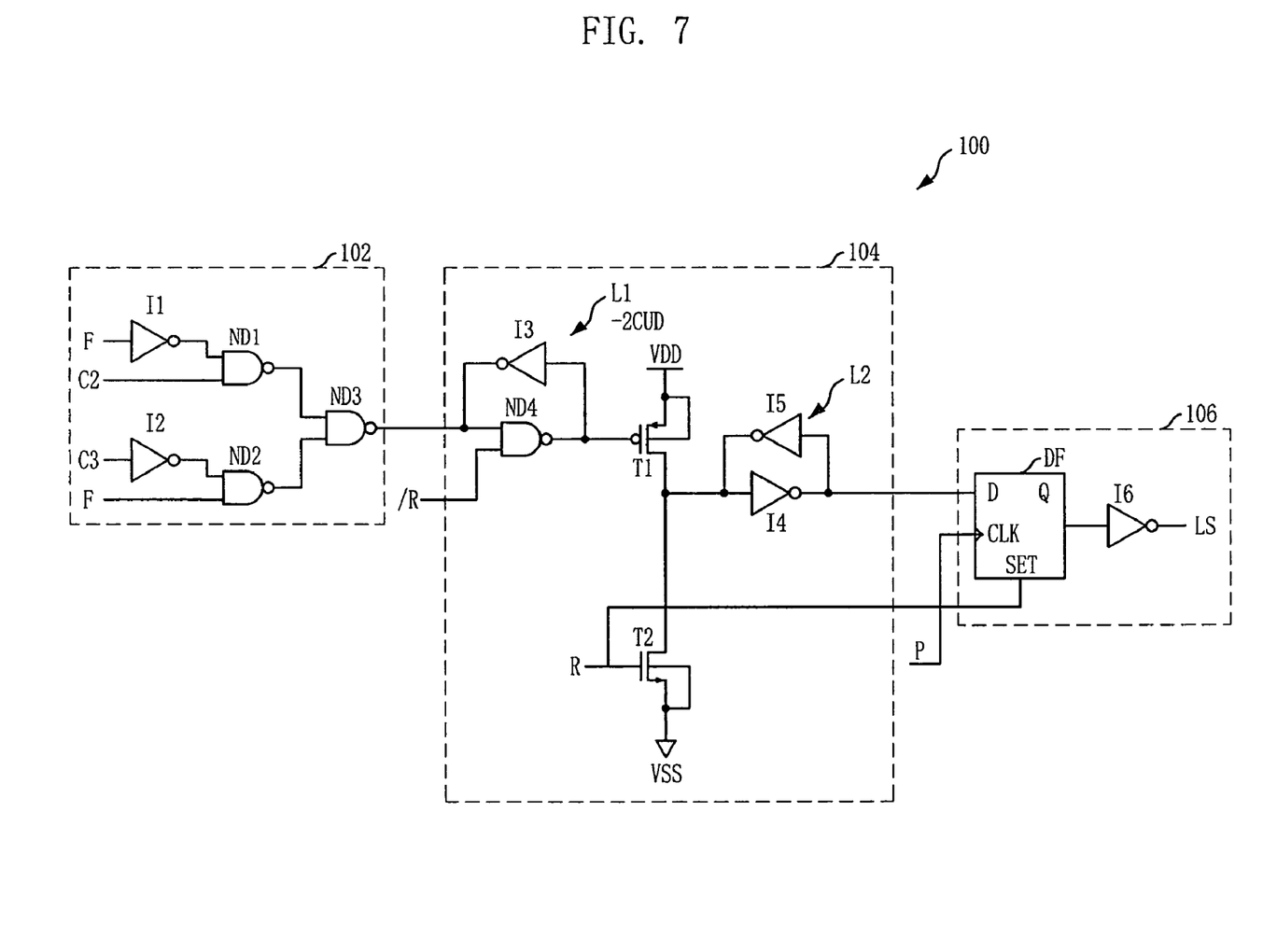
FIG. 7 illustrates a schematic circuit diagram of an embodiment of a locking detector shown in FIG. 5.

FIG. 7 illustrates a schematic circuit diagram of an embodiment of the locking detector 100 shown in FIG. 5.

As shown, the locking detector includes a signal input block 100A, a latch block 100B, and a signal output block 100C. The signal input block 100A recognize a locking state based on first and second detection signals C2 and C3, i.e., the comparison results from the first and second phase comparators 170A and 170B. The latch block 100B latches an output of the signal input block 100A, and the signal output block 100C outputs a locking signal LS in response to a latched signal in the latch block 100B.

In detail, the signal input block 100A includes a first inverter I1 for converting a third detection signal F outputted from the third phase comparator 170C, a first logic NAND gate ND1 for performing a NAND operation on an output of the first inverter I1 and the first detection signal C2, a second inverter I2 for converting a second detection signal C3 outputted from the second phase comparator 170B, a second logic NAND gate ND2 for performing a NAND operation on an output of the second inverter I2 and the third detection signal F, and a third logic NAND gate ND3 for performing a NAND operation on outputs of the first and second NAND gates ND1 and ND2.

The latch block 100B includes a first latch L1 for latching an output of the signal input block 100A in response to an inverse reset signal /R and a second latch L2 for latching an output of the first latch L1 in response to a reset signal R.

The signal output block 100C includes a flip-flop DF for latching an output of the latch block 100B in response to the reset signal R and an inverter I6 for inverting an output of the flip-flop DF to thereby generate the locking signal LS.

Figure 8A:
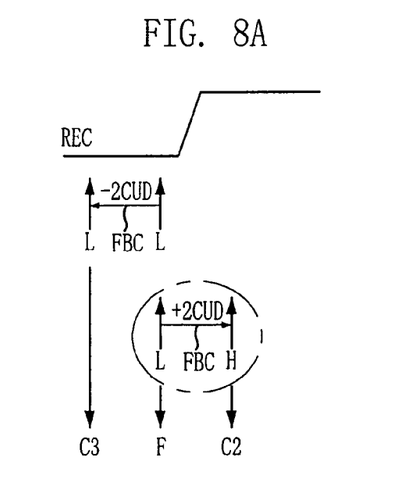
FIGS. 8A to 8C illustrate timing diagrams describing an operation of the delay locked loop shown in FIG. 5.
Figure 8B:
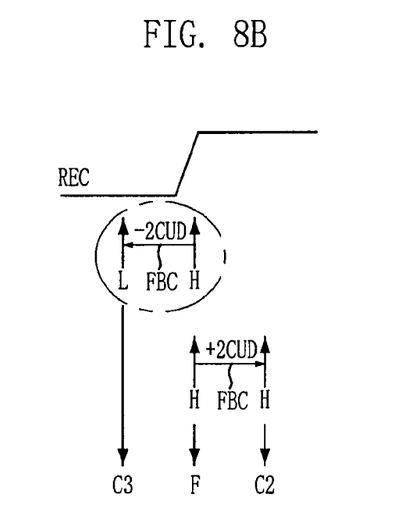
Figure 8C:
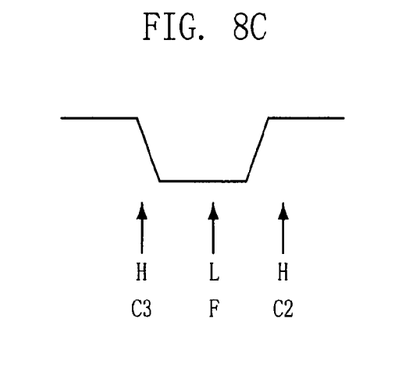

FIGS. 8A to 8C illustrate timing diagrams describing an operation of the delay locked loop shown in FIG. 5. Hereinafter, the delay locking operation and an operation of the locking detector 95 is shown in detail, referring to FIGS. 5 to 8C.

The clock buffer 110 receives the system clocks CLK and CLKB to generate a reference clock REC. The coarse delay line 120 delays the reference clock REC by a delay amount which is initially set, and the fine delay line 130 delays an output of the coarse delay line 120 by an initial delay amount. The duty compensator 140 compensates a duty ratio of the output from the fine delay line 130 to output to the delay model 150. The delay model 150 delays the output of the duty compensator 140 by the modeled delay time to generate the feedback clock FBC.

The first phase comparator 170A compares the reference clock REC outputted from the clock buffer 110 with an output of the first delay block 190A, which is delayed from the feedback clock FBC outputted from the delay model 150 by a delay time of two delay units in the coarse delay line 130. If phases of two input signals, i.e., the reference clock REC and the output of the first delay block 190A, are not the same, the first phase detection signal C2 is inactivated. The second phase comparator 170B compares the feedback clock FBC with an output of the second delay block 190B, which is delayed from the reference clock REC by the delay time of two delay units. If phases of two input signals, i.e., the feedback clock FBC and the output of the second delay block 190B, are not the same, the first phase detection signal C2 is inactivated.

The locking detector 100 generates the locking signal LS based on the first and second detection signals C2 and C3. In response to the locking signal LS, the delay controller 180 controls a delay amount of the coarse delay line 120. For example, if the locking signal LS is activated, the delay controller 180 locks the delay amount of the coarse delay line 120. Namely, if the locking signal LS is activated, operation for adjusting or changing a delay amount of the coarse delay line 20 is terminated.

Thereafter, the fine delay line 130 delays the output of the coarse delay line 120 by an initial delay amount. The duty compensator 140 compensates a duty ratio of the output from the fine delay line 130 to output to the delay model 150. The delay model 150 delays the output of the duty compensator 40 by the modeled delay time to generate the feedback clock FBC.

The third phase comparator 170C compares the feedback clock FBC with the reference clock REC to generate a third detection signal F. If the feedback clock FBC and the reference clock REC have substantially different phases, the third detection signal F is inactivated. Otherwise, if phases of two signals of the third phase comparator 170C, i.e., the feedback clock FBC and the reference clock REC, are the same, the third detection signal F is activated. In response to the inactivated third detection signal, the delay controller 180 controls a delay amount of the fine delay line 130. Otherwise, based on activated third detection signal, the delay controller 180 locks the delay amount of the fine delay line 130. When the delay amounts of the coarse and fine delay lines 120 and 130 are locked, the delay locking operation is terminated and the semiconductor memory apparatus achieves the locking state. Herein, the delay locked clock CKOUT outputted from the clock output buffer 160 is used for a data output. The semiconductor memory apparatus outputs plural data in synchronization with transitions of the delay locked clock CKOUT.

Further, operations of the locking detector 100 and the first to third phase comparators 170A to 170C are described in detail.

Referring to FIG. 8A, the first phase comparator 170A compares the reference clock REC with an output of the first delay block 190A, i.e., a signal delayed by a delay time of two coarse delay units from the feedback clock FBC to generate the first detection signal C2.

Referring to FIG. 8B, the second phase comparator 170B compares the feedback clock FBC with an output of the second delay block 190B, which is delayed from the reference clock REC by the delay time of two coarse delay units to generate the second detection signal C3. Practically, the second phase comparator 170B can recognize that the feedback clock FBC is in advance by the delay time of two coarse delay units. Herein, the semiconductor memory apparatus cannot advance a phase of inputted signal such as the feedback clock FBC. However, by delaying another signal, i.e., the reference clock REC, by a predetermined delay time, the feedback clock FBC can be substantially advanced. Though the second delay block 190B includes two coarse delay units, the number of the coarse delay blocks included in the first and second delay block 190A and 190B can be changed according to circumstance and condition on operation of a system having the semiconductor memory apparatus, in another embodiment of the present invention.

If the locking signal LS is generated based on the comparison results of the first and second phase comparators 170A and 170B, the locking signal LS can have a desirable logic level, i.e., not properly activated or inactivated, even though the reference clock REC is distorted by jitter. In order to activate the locking signal LS for terminating an operation of adjusting and controlling a delay amount of the coarse delay line 130, phases of each two signals inputted to each of the first and second phase comparators 170A and 170B are adjusted and controlled to escape a period distorted by the jitter.

Meanwhile, when a frequency of the system clock is high, the first and second detection signals C2 and C3 outputted from the first and second phase comparators 170A and 170B can be outputted as shown in FIG. 8C. In this case, similar to a method as shown in FIG. 8A, a rising edge of the reference clock REC can be determined. First, the semiconductor memory apparatus delays the feedback clock FEC and the reference clock REC by the delay time of two coarse delay units respectively, and the first and second phase comparators 170A and 170B generates the first and second detection signals C2 and C3 based on above delayed signals. Thereafter, the locking detector 100 generates the locking signal LS in response to the first and second detection signals C2 and C3.

As above described, although the reference clock REC is distorted by jitter, it is prevented that the first and second phase comparators 170A and 170B may not detect a timing of a rising or falling edge of the reference clock REC. Accordingly, even though a system clock distorted by jitter is inputted, the semiconductor memory device can output plural data in synchronization with the system clock properly.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory apparatus, comprising:
a delay line configured to delay a reference clock;
a first delay block configured to delay a feedback clock;
a first phase comparator configured to compare the reference clock with an output of the first delay block;
a second delay block configured to delay the reference clock;
a second phase comparator configured to compare the feedback clock with an output of the second delay block;
a delay controller configured to control a delay amount of the delay line based on comparison results from the first and second phase comparators;
a delay model configured to delay an output of the delay line by a modeled delay time to generate the feedback clock; and
a locking detector configured to control the delay controller based on comparison results from the first and second phase comparators,
wherein the locking detector includes:

a signal input block configured to recognize a locking state based on the comparison results from the first and second phase comparators;
a latch block configured to latch an output of the signal input block; and
a signal output block configured to output a locking state signal in response to a latched signal in the latch block.

2. The semiconductor memory apparatus of claim 1, wherein the first delay block includes a delay unit which is the same as one of a plurality of delay units included in the delay line.

3. The semiconductor memory apparatus of claim 2, wherein the second delay block includes a unit delay which is the same as one of the plurality of delay units included in the delay line.

4. The semiconductor memory apparatus of claim 3, wherein the first and second delay blocks respectively includes two said delay units connected serially to each other.

5. The semiconductor memory apparatus of claim 1, further comprising a duty compensator configured to compensate a duty ratio of an output from the delay line to generate a delay locked clock having a compensated duty ratio.

6. The semiconductor memory apparatus of claim 1, further comprising a clock input buffer configured to buffer a system clock to generate the reference clock.

7. The semiconductor memory apparatus of claim 5, further comprising a clock output buffer configured to transfer an output of the duty compensator to a data output circuit.

8. A semiconductor memory apparatus, comprising:
a coarse delay line configured to delay a reference clock;
a fine delay line configured to delay an output from the coarse delay line;
a first delay block configured to delay a feedback clock;
a first phase comparator configured to compare the reference clock with an output of the first delay block;
a second delay block configured to delay the reference clock;
a second phase comparator configured to compare the feedback clock with an output of the second delay block;
a third phase comparator configured to compare the feedback clock with the reference clock;
a delay controller configured to control delay amounts of the coarse and fine delay lines based on comparison results from the first to third phase comparators;
a delay model configured to delay an output of the delay line by a modeled delay time to generate the feedback clock; and
a locking detector configured to control the delay controller based on comparison results from the first and second phase comparators.

9. The semiconductor memory apparatus of claim 8, wherein the first delay block includes a unit delay which is the same as one of a plurality of delay units included in the delay line.

10. The semiconductor memory apparatus of claim 9, wherein the second delay block includes a delay unit which is the same as one of said plurality of delay units included in the delay line.

11. The semiconductor memory apparatus of claim 10, wherein the first and second delay blocks respectively includes two said delay units connected serially to each other.

12. The semiconductor memory apparatus of claim 8, further comprising a duty compensator configured to compensate a duty ratio of an output from the delay line to generate a delay locked clock having a compensated duty ratio.

13. The semiconductor memory apparatus of claim 8, further comprising a clock input buffer configured to buffer a system clock to generate the reference clock.

14. The semiconductor memory apparatus of claim 12, further comprising a clock output buffer configured to transfer an output of the duty compensator to a data output circuit.

15. The semiconductor memory apparatus of claim 8, wherein the locking detector includes:
a signal input block configured to recognize a locking state based on the comparison results from the first and second phase comparators;
a latch block configured to latch an output of the signal input block; and
a signal output block configured to output a locking state signal in response to a latched signal in the latch block.

16. The semiconductor memory apparatus of claim 15, wherein the signal input block includes:
a first logic unit configured to perform a first logic operation on the comparison results from the first and third phase comparators;
a second logic unit configured to perform a second logic operation on the comparison results from the second and third phase comparators; and
a third logic unit configured to perform a third logic operation on outputs from the first and second logic units.

17. The semiconductor memory apparatus of claim 15, wherein the latch block includes:
a first latch configured to latch an output of the signal input block in response to a reset signal; and
a second latch configured to latch an output of the first latch in response to an inverse signal of the reset signal.

18. The semiconductor memory apparatus of claim 15, wherein the signal output block includes:
a latch configured to latch an output of the latch block in response to an inverse signal of reset signal; and
an inverter configured to invert an output of the latch.

19. A method for operating a semiconductor memory apparatus, comprising:
delaying a reference clock by a delay amount to generate a delay clock;
delaying a feedback clock by a first amount to generate a delayed feedback clock;
comparing the reference clock with the delayed feedback clock;
delaying the reference clock by a second amount to generate a delayed reference clock;
comparing the feedback clock with the delayed reference clock;
controlling the delay amount based on results of the comparing the reference clock with the delayed feedback clock and the comparing the feedback clock with the delayed reference clock;
delaying the delay clock by a modeled delay time to generate the feedback clock; and
controlling the controlling the delay amount based on the results.

20. The method of claim 19, wherein the delay amount is initially a delay time of a delay unit, and the first and second amounts are double the delay time of the delay unit.

21. The method of claim 20, further comprising compensating a duty ratio of the delay clock to generate a delay locked clock having a compensated duty ratio.

22. A method for operating a semiconductor memory apparatus, comprising:
delaying a reference clock by a first delay amount to generate a first delay clock;

delaying the first delay clock by a second delay amount to generate a second delay clock;

delaying a feedback clock by a first amount to generate a delayed feedback clock;

comparing the reference clock with the delayed feedback clock;

delaying the reference clock by a second amount to generate a delayed reference clock;

comparing the feedback clock with the delayed reference clock;

comparing the feedback clock with the reference clock;

controlling the first and second delay amounts based on comparison results of the comparing the reference clock with the delayed feedback clock, the comparing the feedback clock with the delayed reference clock, and the comparing the feedback clock with the reference clock; and delaying the second delay clock by a modeled delay time to generate the feedback clock.

23. The method of claim 22, wherein the first and second delay amounts are initially one delay time of different delay units, and the first and second amounts are double the delay time of the respective delay units.

24. The method of claim 23, wherein the first delay amount is larger than the second delay amount.

25. The method of claim 22, further comprising compensating a duty ratio of the second delay clock to generate a delay locked clock having a compensated duty ratio.

26. A semiconductor memory apparatus, comprising:

a delay locked loop configured to perform a delay locking operation by comparing a reference clock with a feedback clock to thereby generate a delay locked clock; and a locking detector configured to control the delay locking operation based on results of comparing a delay signal of the reference clock with the feedback clock and comparing the reference clock with a delay signal of the feedback clock, wherein the delay signals of the reference clock and the feedback clock are generated by delaying the reference clock and the feedback clock by double a delay time of a delay unit used for the delay locking operation.

27. The semiconductor memory apparatus of claim 26, wherein the delay locked loop includes:

a delay line configured to delay the reference clock;

a first delay block configured to delay the feedback clock;

a first phase comparator configured to compare the reference clock with an output of the first delay block;

a second delay block configured to delay the reference clock;

a second phase comparator configured to compare the feedback clock with an output of the second delay block;

a delay controller configured to control a delay amount of the delay line based on comparison results from the first and second phase comparators; and a delay model configured to delay an output of the delay line by a modeled delay time to generate the feedback clock.

* * * * *